(12) United States Patent
Bang et al.

(10) Patent No.: US 7,369,400 B2
(45) Date of Patent: May 6, 2008

(54) DISPLAY APPARATUS HAVING IMPROVED HEAT DISSIPATION CAPABILITIES

(75) Inventors: Won-Kyu Bang, Asan-si (KR); Ki-Jung Kim, Cheonan-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 40 days.

(21) Appl. No.: 10/820,696

(22) Filed: Apr. 9, 2004

(65) Prior Publication Data

US 2005/0047067 A1    Mar. 3, 2005

(30) Foreign Application Priority Data

Sep. 1, 2003    (KR) ...................... 10-2003-0060751

(51) Int. Cl.
*G06F 1/16* (2006.01)
(52) U.S. Cl. ......................................... 361/681; 345/58
(58) Field of Classification Search ................ 361/687, 361/681, 688, 690, 692
See application file for complete search history.

(56) References Cited

U.S. PATENT DOCUMENTS

| | | | | |
|---|---|---|---|---|
| 4,980,848 | A | * | 12/1990 | Griffin et al. ................ 361/687 |
| 5,596,483 | A | * | 1/1997 | Wyler ........................ 361/683 |
| 5,796,578 | A | * | 8/1998 | Jones ......................... 361/683 |
| 6,104,451 | A | * | 8/2000 | Matsuoka et al. ............. 349/58 |
| D448,769 | S | * | 10/2001 | Jung ......................... D14/374 |
| 6,577,502 | B1 | * | 6/2003 | DiStefano et al. .......... 361/687 |
| 6,594,147 | B2 | * | 7/2003 | Heirich et al. .............. 361/687 |
| 6,894,739 | B2 | * | 5/2005 | Sung et al. ................... 349/58 |
| 2002/0149906 | A1 | * | 10/2002 | Ichimura .................... 361/681 |
| 2004/0036819 | A1 | * | 2/2004 | Ryu et al. .................... 349/58 |
| 2005/0041390 | A1 | * | 2/2005 | Huang ....................... 361/687 |

FOREIGN PATENT DOCUMENTS

KR         1020000011358 A      2/2000

OTHER PUBLICATIONS

"Flange", Webster's New World Dictionary of American English, Third College Edition 1998, p. 513.
"¹ Flange", Webster's Third New International Dictionary unabridged 1986, p. 864.
Office Action from the Korean Industrial Property Office issued in Applicant's corresponding Korean Patent Application No. 10-2003-0060751 dated Mar. 25, 2005 (English translation is attached).

* cited by examiner

*Primary Examiner*—Lisa Lea-Edmonds
(74) *Attorney, Agent, or Firm*—Robert E. Bushnell, Esq.

(57) ABSTRACT

A design for a display apparatus that allows for improved convection for the removal of hot air from heated circuit components. The display apparatus includes a display panel, a chassis having a base, which supports the display panel, and a flange formed along an upper edge of the base to prevent the base from bending, the flange having at least one air passage hole to allow smooth air flow. The display apparatus also has a printed circuit board on which parts for driving the display panel are mounted, the printed circuit board being supported by the chassis, and a case which accommodates the display panel, the chassis, and the printed circuit board. The case also is perforated by two sets of holes to allow hot air to escape and cool air to enter the display apparatus.

10 Claims, 5 Drawing Sheets

DISPLAY APPARATUS HAVING IMPROVED HEAT DISSIPATION CAPABILITIES

CLAIM OF PRIORITY

This application makes reference to, incorporates the same herein, and claims all benefits accruing under 35 U.S.C. §119 from an application for DISPLAY APPARATUS earlier filed in the Korean Intellectual Property Office on 1 Sep. 2003 and there duly assigned Serial No. 2003-60751.

BACKGROUND OF THE INVENTION

1. Field of the Invention

The present invention relates to a display apparatus, and more particularly, to a design for a display apparatus that allows for improved heat dissipation via convection.

2. Description of the Related Art

Display panels, especially plasma display panels, generate a lot of heat when the display is displaying images. It is important that displays be designed so that they can efficiently dissipate heat to prevent the components of the display from reaching a high temperature. If the components of the display reach a high enough temperature, the display can become dangerous to touch. Also, if allowed to raise to a high enough temperature, components is the display device can malfunction.

SUMMARY OF THE INVENTION

It is therefore an object of the present invention to provide an improved design for a display panel that results in a functioning display panel to function at a lower temperature.

It is also an object of the present invention to provide a design for a display that improves air circulation within the functioning display while not degrading in the structural integrity of the display.

These and other objects can be achieved by a display apparatus that includes a display panel, a chassis having a base which supports the display panel, and a flange formed along an upper edge of the base to prevent the base from bending, the flange being perforated by at least one air passage hole to allow hot air inside the chassis to easily escape from the display virtually unhindered. The display apparatus also includes a printed circuit board and flexible printed circuits which drive the display and produce heat, the printed circuit board being supported by the chassis, and a case accommodating the display panel, the chassis, and the printed circuit board. The air passage holes in the flange of the chassis may have a rectangular or elliptical shape. The flange may have a plurality of air passage holes and further have a reinforcing rib. These air passages in the flanged portion of the chassis, in addition to holes in the rear cover, provide for efficient and relatively unhindered convection of air within the functioning display apparatus. Therefore, if no fans are used, the design of the present invention improves non-forced air convection in the display. In the case that fans are present, the design of the present invention enhances the forced convection of air.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
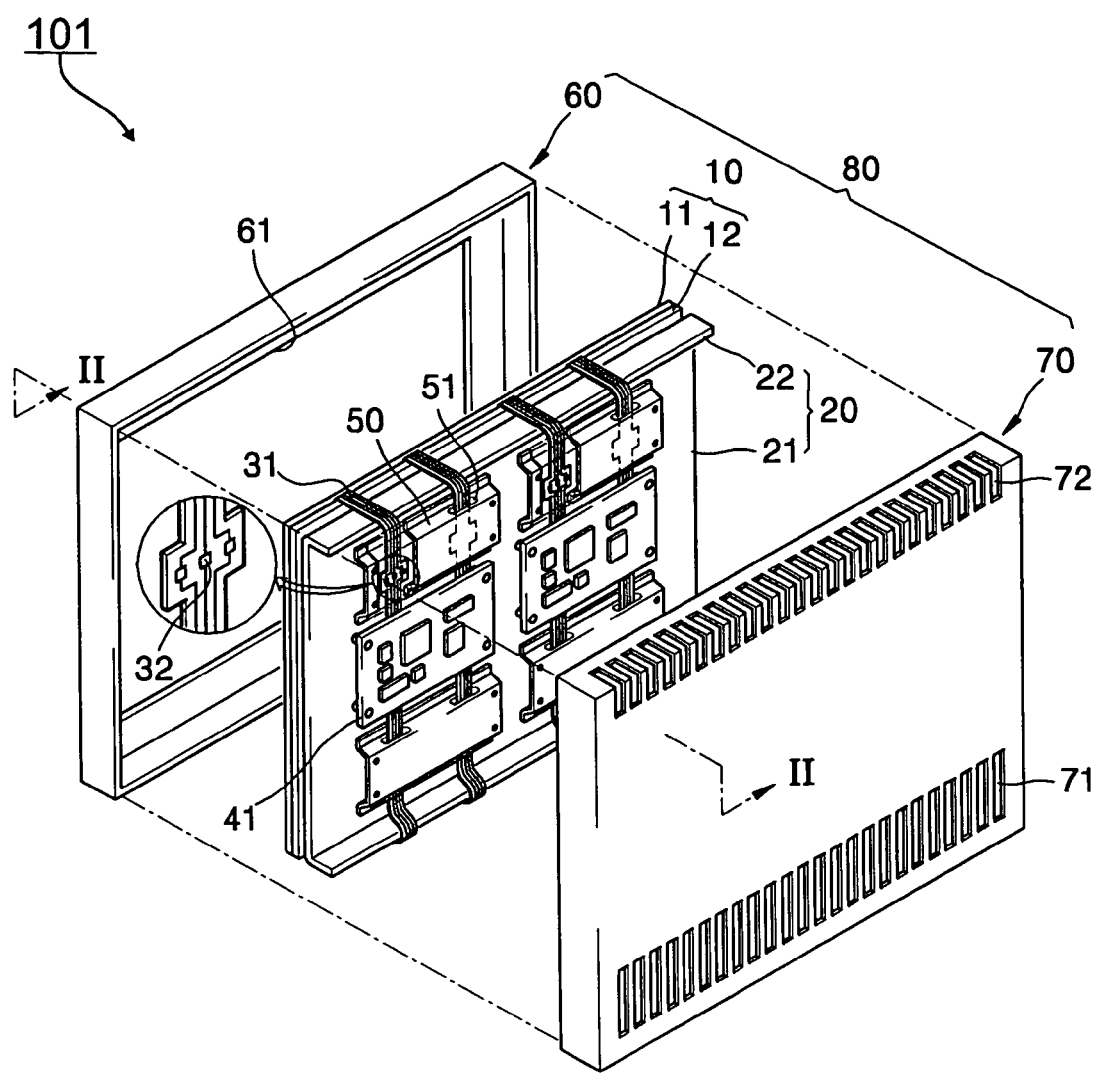
FIG. 1 is an exploded perspective view of a display apparatus.
Figure 2:
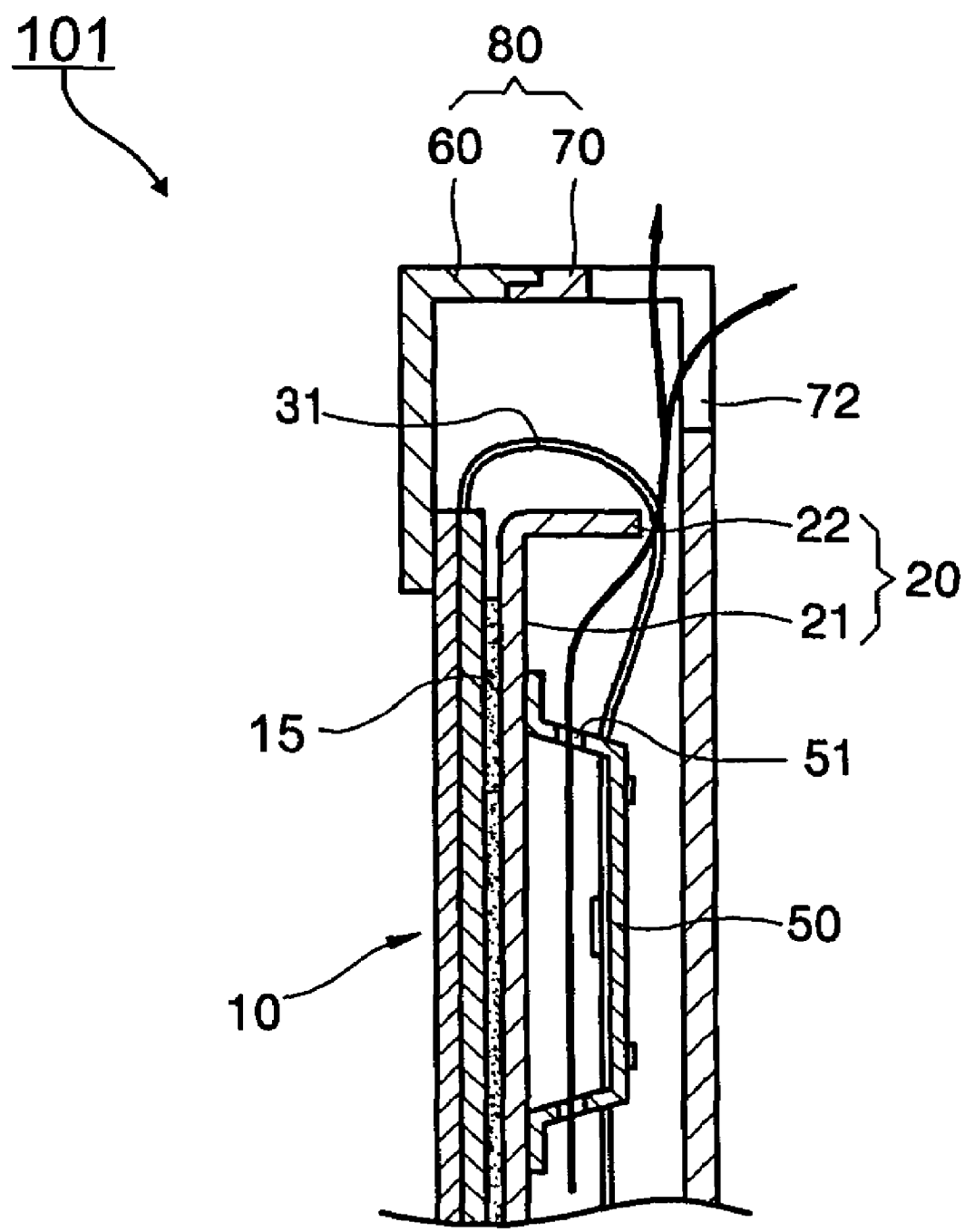
FIG. 2 is a sectional view of the assembled display of FIG. 1, taken along line II-II in FIG. 1.

Turning now to the figures, FIGS. 1 and 2 illustrate a display apparatus 101. The display apparatus 101 in FIGS. 1 and 2 have a display panel 10 having a front plate 11 and a rear plate 12, a chassis 20 having a base 21 supporting the display panel 10, the chassis also having a flange 22. Flange 22 serves to prevent the base 21 from bending. Base 21 of chassis 20 is attached to display panel 10 by a thermally conductive heat dissipating sheet 15 as illustrated in FIG. 2. Printed circuit boards (PCBs) 41 are mounted on the chassis 20. PCBs 41 contain heat producing parts that drive the display panel 10. Parts could be circuits, circuit components, IC chips and so forth. Examples of the parts mounted on the PCB 41 include a circuit for supplying power, a circuit for applying image signals to the display panel 10, IC chips related to power supplies that generate a lot of heat and the like. Display apparatus 101 also includes a case 80 accommodating the display panel 10, the chassis 20, and the PCBs 41. The display panel 10 and the PCBs 41 are electrically connected to each other by flexible printed circuits (FPCs) 31. FPCs 31 are made out of at least two insulating layers, one of which is a flexible substrate on which circuits are printed. In addition, chips-on-film (or COFs) 32 are mounted on the FPCs 31. Here, the film in chips-on-film refers to the FPCs 31 since the FPCs 31 are in the form of a film. COFs 32 on FPCs 31 are used in addition to the PCBs 41 to drive the display panel 10 and to save space. COF 32 along with parts on the PCB 41 drive the display panel 10 and generate a lot of heat in driving the display 10. The case 80 includes a front case 60 perforated by a window 61 and a rear case 70 perforated by air inlet holes 71 at a bottom of rear case 70 and air outlet holes 72 at a top of rear case 70. Reinforcing members 50 are attached to the chassis 20 and also serve to prevent the chassis 20 from bending. Reinforcing members 50 are perforated by apertures 51. The FPCs 31 run through apertures 51 as illustrated in FIG. 2.

When the flange 22 of the chassis 20 is bent toward the rear case 70, the flange 22 obstructs the ability of hot air generated by COFs 32 and PCBs 41 from rising and escaping from the display apparatus 101 via the air outlet holes 72. In particular, as illustrated in FIG. 2, the flange 22 blocks the path of upwardly rising hot air, which is denoted by arrows, so that the heat generated by the circuits and other heat generating sources cannot effectively dissipate. In order for the rising hot air to escape through air outlet holes 72 of rear case 70, the hot air must take a detour and go around flange 22 to reach air outlet holes 72. Because the rising hot air must take this large detour to exit the display apparatus 101, the convection of the hot air is impeded and thus causes the temperature inside the display apparatus 101 to increase. As a result, the temperature of the parts within the case 80 as well as the temperature of the case 80 itself rise too high so that a user may get burned when touching the hot case 80. Furthermore, the display panel 10 as well as COFs 32 and PCBs 41 may not operate properly due to the extreme heat. These heat related problems are more serious in a plasma display panel, which generates more heat than other types of displays.

Figure 3:
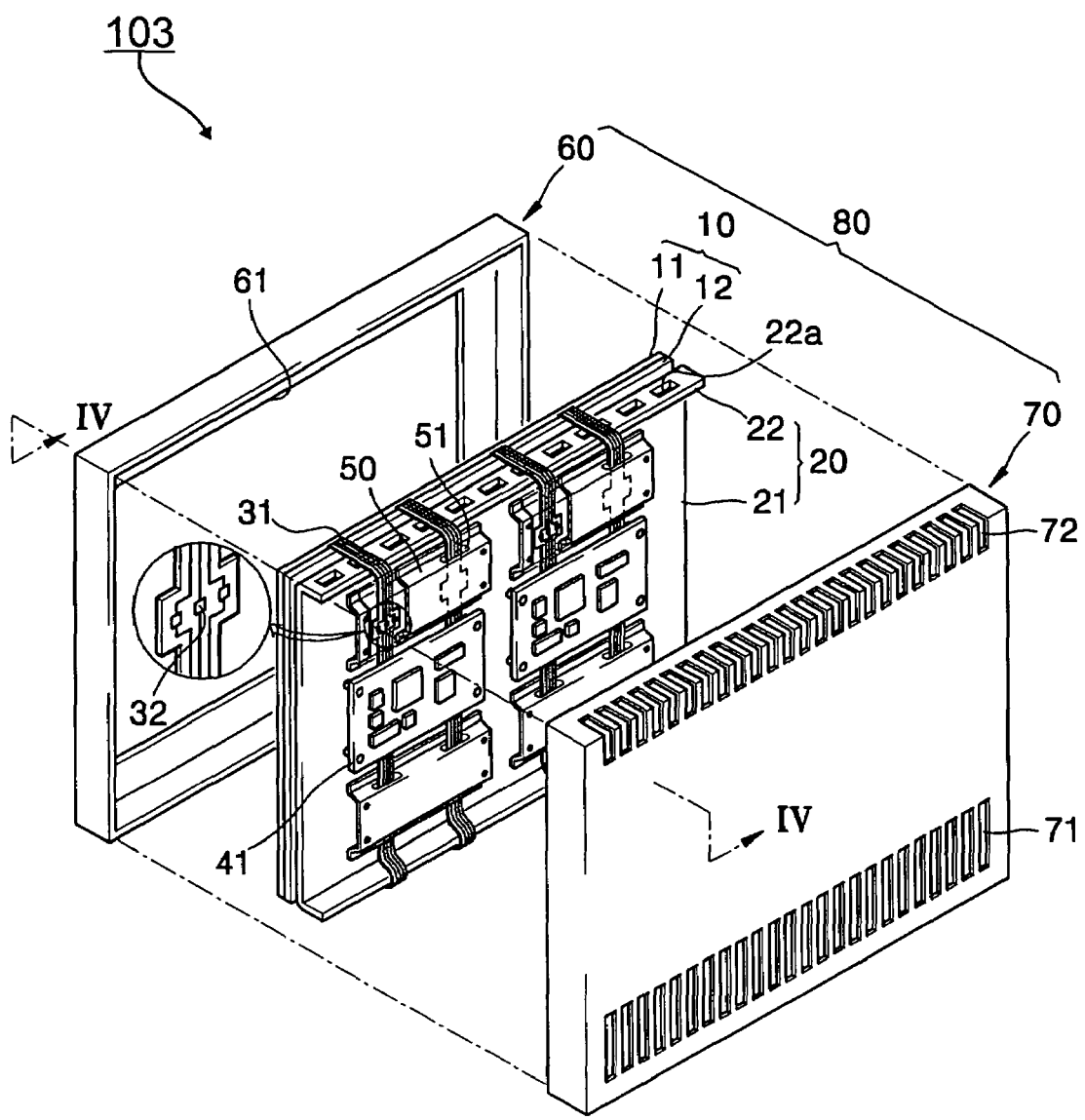
FIG. 3 is an exploded perspective view of a display apparatus according to an embodiment of the present invention.
Figure 4:
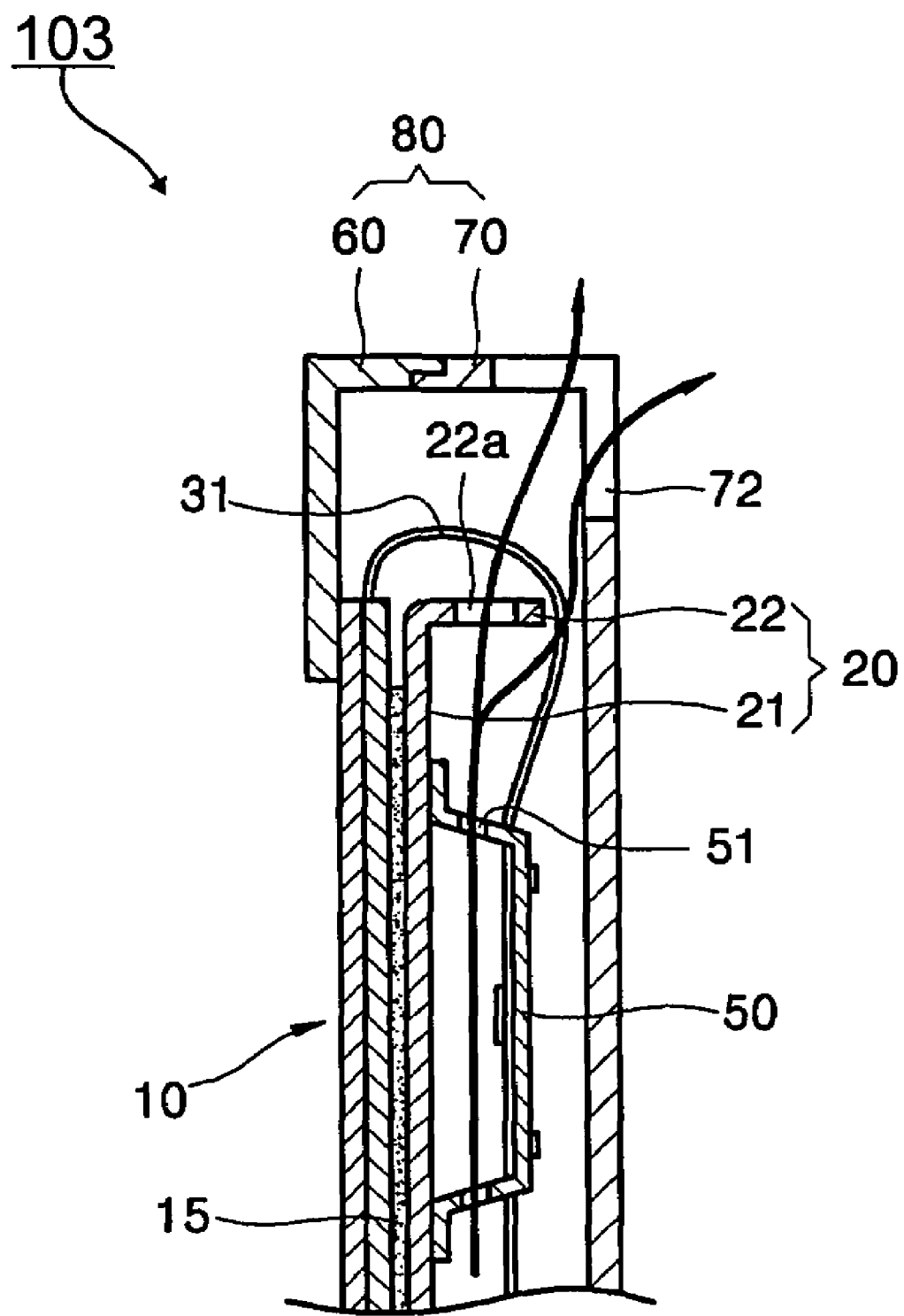
FIG. 4 is a sectional view of the assembled display apparatus of FIG. 3, taken along line IV-IV in FIG. 3.

Turning now to FIGS. 3 and 4, FIGS. 3 and 4 illustrate a display apparatus 103 according to an embodiment of the present invention. Referring to FIGS. 3 and 4, display apparatus 103 according to an embodiment of the present invention includes a display panel 10, a chassis 20, a printed circuit board (PCB) 41, and a case 80. The display panel 10 may be an arbitrary flat display panel. Examples of the display panel 10 include a liquid crystal display panel, a plasma display panel, and the like. Since discharging occurs within plasma display panels, more heat is generated in plasma display panels than in liquid crystal display panels. Therefore, it is very important that a plasma display apparatus be designed in such a way that provides little resistance to hot air trying to rise and escape from an interior of the display.

Turning to FIGS. 3 and 4, display panel 10 includes a front plate 111 and a rear plate 12. The front plate 11 may include a front substrate, discharge sustain electrodes arranged on a rear surface of the front substrate, a front dielectric layer covering the discharge sustain electrodes, and a protective layer (MgO) covering the front dielectric layer. The rear plate 12 may include a rear substrate, address electrodes arranged on a front surface of the rear substrate in perpendicular to the discharge sustain electrodes, a rear dielectric layer covering the address electrodes, barriers formed on the rear dielectric layer to define light-emitting cells, and a light-emitting coated on the inside of the luminescent cells.

The chassis 20 may be manufactured by molding or pressing. The chassis 20 supports the display panel 10 and the PCBs 41. A thermally conductive heat-dissipating sheet 15 is interposed between the display panel 10 and the chassis 20, as illustrated in FIG. 4. The chassis 20 has a flange 22 along an upper edge to prevent base 21 from bending. The flange 22 is perforated by at least one hole 22a and, preferably, is perforated by a plurality of air passage holes 22a. The base 21 and the flange 22 may be manufactured separately and then joined with each other. Preferably, the base 21 and the flange 22 are formed as a single integrated monolithic unit. A reinforcing member 50 is attached to the base 21 of the chassis 20 to further prevent bending of the chassis 20.

Parts for driving the display panel 10 are mounted on the PCB 41. Parts in this disclosure mean any kind of electrical or electronic device that generates heat when it is functioning. Parts could be circuits, circuit components, IC chips and so forth. Examples of the parts mounted on the PCB 41 include a circuit for supplying power, a circuit for applying image signals to the display panel 10, IC chips related to power supplies that generate a lot of heat and the like. The display panel 10 and the PCBs 41 are electrically connected to each other via a flexible printed circuit (FPC) 31. FPC 31 is made out of at least two insulating layers, one of the layers being a flexible substrate on which circuits are printed. The FPC 31 passes through apertures 51 perforating reinforcing member 50. Like flange 22, reinforcing member 50 also serves to prevent chassis 20 from bending. A chip-on-film (COF)32, which also drives the display panel 10 together with the parts mounted on the PCB 41, is mounted on the FPC 31. COF 32 refers to FPC 31, since FPC 31 is in the form of a film. Flexible printed circuits and chips-on-film are often used to save space.

The display panel 10, the chassis 20, the COFs 32 and the PCB 41 are accommodated in case 80. Case 80 includes a front case 60 with a window 61 and a rear case 70 with air inlet holes 71 in a lower portion and air outlet holes 72 in an upper portion.

In the display apparatus 103 having the structure described above, a large amount of heat is generated by the display panel 10, the parts mounted on the PCBs 41, and the COF 32. When the display panel 10 is a plasma display panel, the COF 32 generates a larger amount of heat because COF 32 performs address discharging 480 times per second to display images using a 256-gray scale. The heat can be smoothly dissipated by cool air entering the case 80 through the air inlet holes 71 and hot air coming out of the case 80 through the air exhaust holes 72.

In the present invention, flange 22 of chassis 20 is perforated by holes 22a at intervals along the flange 22 to allow hot air generated by the PCBs 41 and the COFs 32 to escape from an inside of chassis 20 so that the hot air can easily reach and exit display apparatus 103 via the air outlet holes 72. Thus, by perforating flange 22 on chassis 20 by one or more holes 22a, heat generated inside the display apparatus 103 by the COFs 32 and the PCBs 41 can rise and escape from the display apparatus more easily, more efficiently and with less resistance than if flange 22 on chassis 20 were solid and not perforated with holes. If flange 22 were solid, hot air generated by the COFs 32 and the PCBs 41 would rise within chassis 20 and get trapped by the base 21 and the flange 22 and would instead have to go around the flange instead of going through holes 22a. This would obstruct the path of the rising hot air. As a result, the heat generated in the case 80 is more effectively dissipated out of the case 80 when flange 22 of chassis 20 is perforated by air vent holes 22a.

The basic function of the flange 22 is to prevent bending of the base 21 of the chassis 20. Therefore, the size and interval of the air passage holes 22a to be formed in the flange 22 vary depending on the thickness of the chassis 20 and the load to be applied to the chassis 20 such that the flange 22 can perform its basic function. One design consideration in deciding the size and interval of the holes 22a formed in flange 22 is the shape of the holes 22a.

Figure 5:
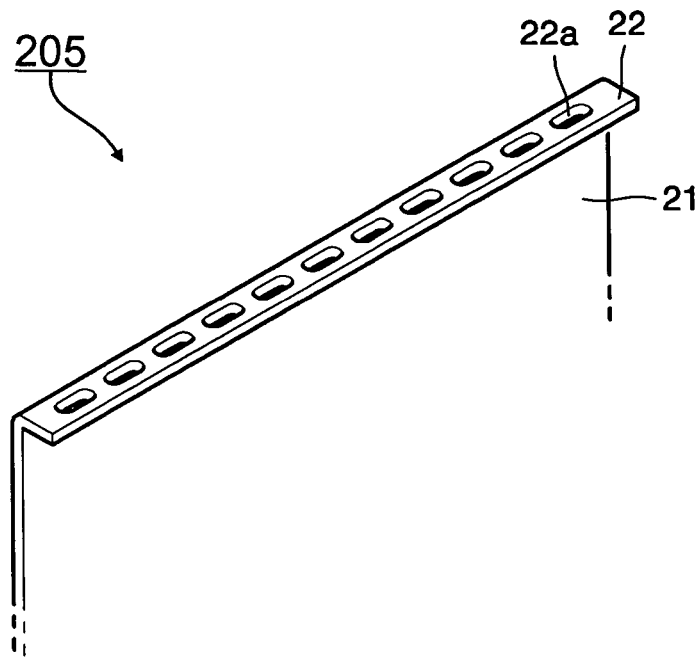
FIG. 5 illustrates an example of a chassis for a display apparatus according to the present invention.

The air passage holes 22a may have an arbitrary geometrical shape, for example, a rectangular shape, an elliptical shape, etc. FIG. 5 illustrates one example of a chassis 205 with elliptical-shaped holes 22a in the flange 22. Chassis 205 may be used in place of the chassis 20 in display apparatus 103 of FIGS. 3 and 4. When holes 22a have an elliptical shape as illustrated in chassis 205 in FIG. 5, the air passage holes 22a may be formed to have a larger cross sectional area than when the holes are rectangular in shape. This is because a flange perforated by rectangular holes cannot withstand as much stress as a flange perforated by elliptical holes. Stress exerted on a flange perforated by rectangular holes is apt to exert force on the corners of the rectangular holes and thus deform the flange because of the sharp corners in a rectangular shaped hole. If the holes are instead elliptical in shape, the flange can handle the stress better and can better prevent the chassis 20 from bending.

Figure 6:
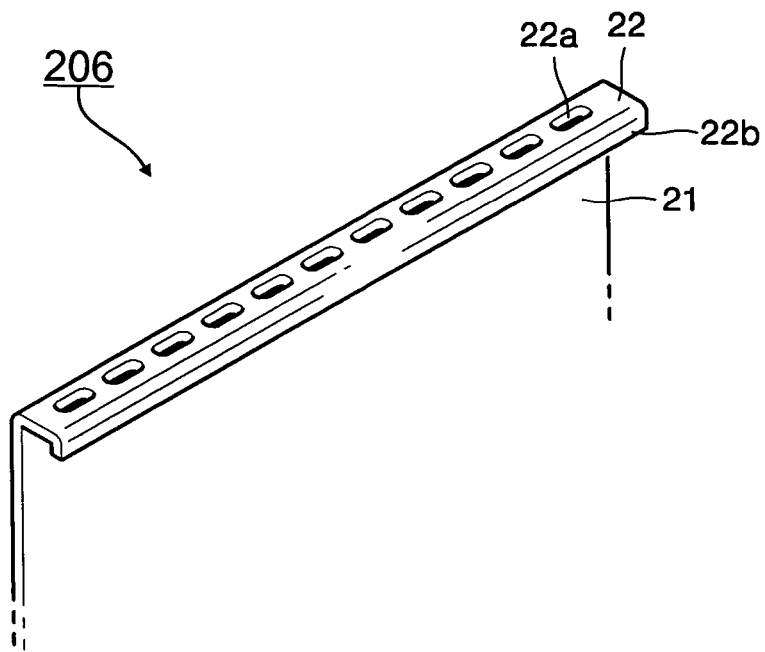
FIG. 6 illustrates another example of a chassis for a display apparatus according to the present invention.

Turning to FIG. 6, FIG. 6 illustrates another example of another chassis 206 having a reinforcing rib 22b in addition to the flange 22 perforated by elliptical-shaped holes 22a.

Chassis 206 could be used in place of chassis 20 in the display apparatus 103 of FIGS. 3 and 4. Like chassis 205, chassis 206 has elliptical air passage holes 22a for smoother air flow while preventing the chassis 206 from bending. The chassis 206 of FIG. 6 has a reinforcing rib 22b which is formed parallel to base 21. The reinforcing rib 22b extends along the length of the flange 22 to prevent bending of the chassis 206. Although the reinforcing rib 22b is illustrated as being integrated with the flange 22 in FIG. 6 and bent perpendicular to the edge of the flange 22, the reinforcing rib 22b may be manufactured as a separate element from the base 21 and the flange 22 and later attached to the flange 22, for example, by welding. The position of the reinforcing rib 22b is not limited to the position illustrated in FIG. 6. For example, the reinforcing rib 22b may be attached to the corner between the flange 22 and the base 21.

A display apparatus according to the present invention with a chassis configured as described above allows smoother air flow in the case so that heat dissipation is improved. While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display apparatus, comprising:
a display panel;
a chassis including a base, the base of the chassis adapted to support the display panel, the chassis further including a flange extending from an upper edge of the base as a single body and arranged along the upper edge of the base and adapted to prevent the base from bending, the flange being perforated by an aperture;
a printed circuit board with a plurality of parts mounted thereon, the printed circuit board being mounted on an opposite side of the base of the chassis than the display panel and being adapted to drive the display panel; and
a case accommodating the display panel, the chassis, and the printed circuit board, the flange extending over and beyond the parts on the printed circuit board.

2. A display apparatus, comprising:
a display panel displaying variable images;
a chassis comprising a base, the base of the chassis supporting the display panel, the chassis further comprising a flange extending from an upper edge of the base as a single body and arranged along the upper edge of the base, the flange being adapted to prevent the base of the chassis from bending, the flange being perforated by a hole;
a printed circuit board with parts mounted thereon, the printed circuit board being mounted on the base of the chassis, the parts on the printed circuit board being adapted to drive the display panel; and
a case housing the display panel, the chassis, and the printed circuit board, the case having a rear cover perforated by two sets of holes, the hole on the flange being near one of said two sets of holes in said rear cover, the chassis further comprising a reinforcing rib attached to an end of the flange opposite the base, the reinforcing rib running along an entire length of the flange, the reinforcing rib extending downward from the flange in a direction parallel to the base of the chassis.

3. A display apparatus, comprising:
a display panel;
a chassis including a base, the base of the chassis being in contact with and attached to an entire rear surface of the display panel and being adapted to support the display panel, the chassis further including a flange extending from an upper edge of the base as a single body with the base, the flange being adapted to prevent the base from bending, the flange being perforated by an aperture;
a printed circuit board with a plurality of parts mounted thereon, the printed circuit board being mounted on the base of the chassis and being adapted to drive the display panel; and
a case accommodating the display panel, the chassis, and the printed circuit board.

4. The display apparatus of claim 3, the printed circuit board being mounted on a side of the base of the chassis opposite to that of the display panel.

5. The display apparatus of claim 3, the flange extending in a direction away from the display panel.

6. The display apparatus of claim 3, the flange extending over a side of the base of the chassis opposite to that of the display panel.

7. A display apparatus, comprising:
a display panel;
a chassis including abase, the base of the chassis adapted to support the display panel, the chassis further including a flange extending from an upper edge of the base and in a direction away from the display panel, the flange being perforated by an aperture;
a printed circuit board with a plurality of parts mounted thereon, the printed circuit board being mounted on the base of the chassis and being adapted to drive the display panel; and
a case accommodating the display panel, the chassis, and the printed circuit board.

8. The display apparatus of claim 7, the chassis base being arranged between the display panel and the printed circuit board.

9. The display apparatus of claim 7, the flange being perforated by a plurality of apertures adapted to allow passage of rising hot air generated by the plurality of parts mounted on the printed circuit board.

10. The display apparatus of claim 7, the flange extending over the printed circuit board.

* * * * *